(12) United States Patent
Ng et al.

(10) Patent No.: US 7,868,660 B2
(45) Date of Patent: Jan. 11, 2011

(54) SERIAL COMMUNICATIONS BUS WITH ACTIVE PULLUP

(75) Inventors: Philip S. Ng, Cupertino, CA (US);
Jinshu Son, Saratoga, CA (US)

(73) Assignee: Atmel Corporation, San Jose, CA (US)

( * ) Notice: Subject to any disclaimer, the term of this patent is extended or adjusted under 35 U.S.C. 154(b) by 41 days.

(21) Appl. No.: 11/379,473

(22) Filed: Apr. 20, 2006

(65) Prior Publication Data
US 2007/0247184 A1 Oct. 25, 2007

(51) Int. Cl.
*H03K 19/0175* (2006.01)

(52) U.S. Cl. .................... 326/82; 710/110; 326/81

(58) Field of Classification Search .......... 326/30, 326/81–83, 86–87, 26; 365/190–195; 710/110, 710/105, 106, 305, 313, 29, 60, 14, 107, 710/113; 348/720, 725, 901, 714, 730, 718–719, 348/836, 530–574, 211, 212
See application file for complete search history.

(56) References Cited

U.S. PATENT DOCUMENTS

| | | | |
|---|---|---|---|
| 5,334,886 A | | 8/1994 | Chaung |
| 5,696,994 A | * | 12/1997 | Pang .......................... 710/64 |
| 6,021,072 A | | 2/2000 | Takeda et al. |
| 6,092,138 A | * | 7/2000 | Schutte ........................ 710/113 |
| 6,405,093 B1 | | 6/2002 | Malcolm et al. |
| 6,693,678 B1 | | 2/2004 | Tults et al. |
| 6,697,897 B1 | * | 2/2004 | Friel et al. ................... 710/105 |
| 6,842,806 B2 | * | 1/2005 | Ervin ........................... 710/110 |
| 6,876,400 B2 | | 4/2005 | Schnellenberger |
| 7,028,209 B2 | * | 4/2006 | Mosley et al. ............... 713/500 |
| 7,095,250 B1 | * | 8/2006 | Stolitzka et al. ............. 326/82 |
| 2002/0176009 A1 | | 11/2002 | Johnson et al. |

FOREIGN PATENT DOCUMENTS

WO  WO-2007/124304 A2  11/2007

OTHER PUBLICATIONS

Philips Semiconductors, "The-I2C-Bus Specification", Jan. 2000, Version 2.1, p. 7, 20-25, 38.*

(Continued)

*Primary Examiner*—James H. Cho
*Assistant Examiner*—Christopher Lo
(74) *Attorney, Agent, or Firm*—Schwegman, Lundberg & Woessner, P.A.

(57) ABSTRACT

A dual-wire communications bus circuit, compatible with existing two-wire bus protocols, includes a first and second part of the communications bus circuit to couple to a communications bus. The bus has a first line for carrying data signals from a master device to one or more slave devices and a second line to carry a clock signal between the devices. A pullup resistor is located in each part of the communications bus circuit; the pullup resistor in the first part couples to the first line of the communications bus and the pullup resistor in the second part couples to the second line of the communications bus. To improve data throughput and reduce noise, an active pullup device, working in conjunction with the pullup resistor, is located in each part of the communications bus circuit, providing a high logic level on at least one of the communications bus lines.

36 Claims, 6 Drawing Sheets

OTHER PUBLICATIONS

Philips Semiconductors, "The 12C-Bus Specification", Jan. 2000, Version 2.1, p. 41.*
Philips Semiconductor, "The 12C Bus Specification", Jan. 2000, Version 2.1, p. 7, 38 and 41.*
P. Horowitz et al., "The Art of Electronics", 2nd Edition, Cambridge Univ. Press, 2 pages.
Website printout: "12C-bus", Philips Semiconductors, Philips Electronics N.V., 2004, 4 pages.
"International Search Report filed in corresponding PCT Application No. PCT/US07/66779", (Feb. 7, 2008), 11 pgs.
"International Application Serial No. PCT/US07/66779, Written Opinion mailed Feb. 7, 2008", 7 pgs.

* cited by examiner

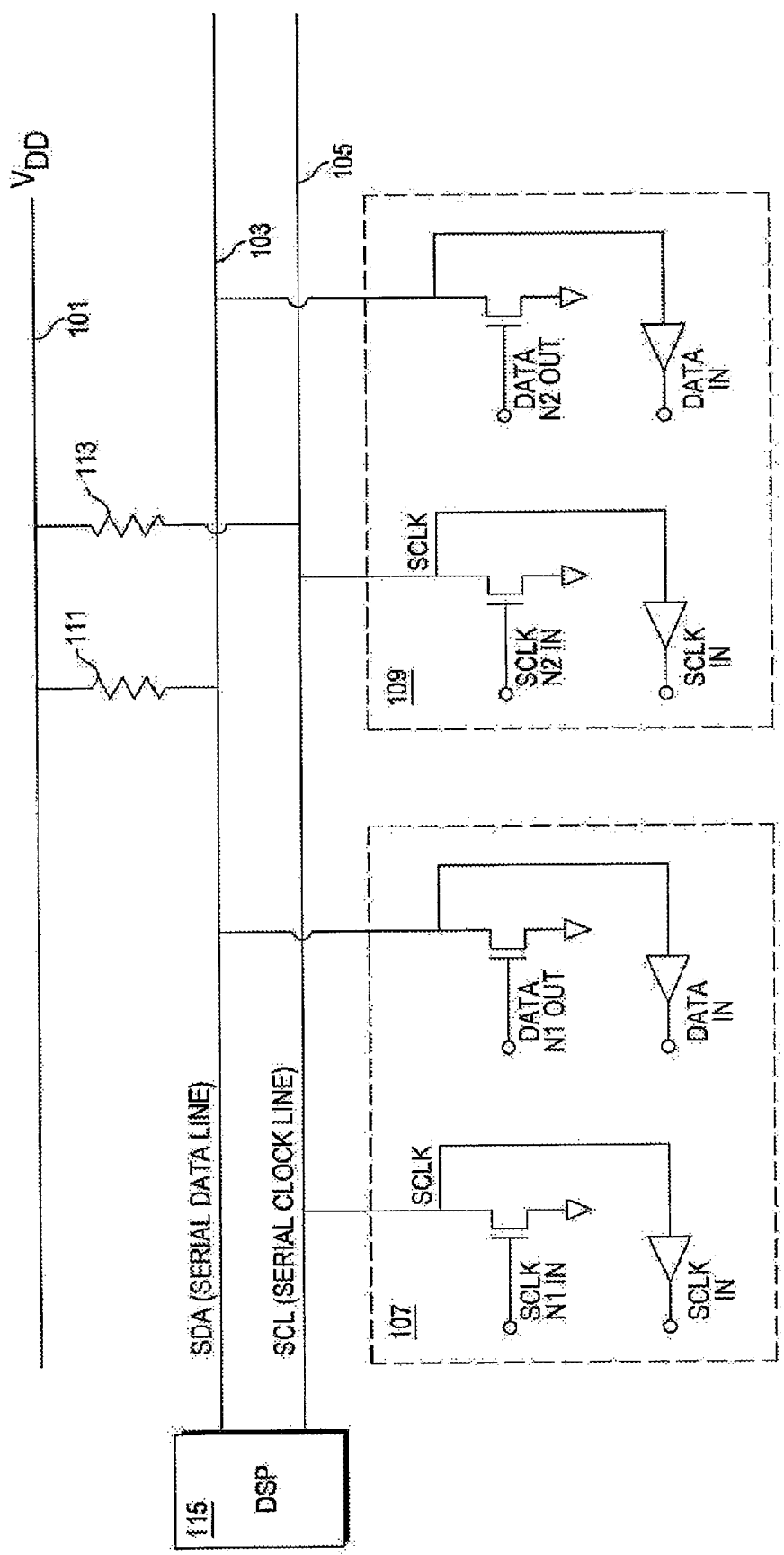
Fig._1A *(Prior Art)*

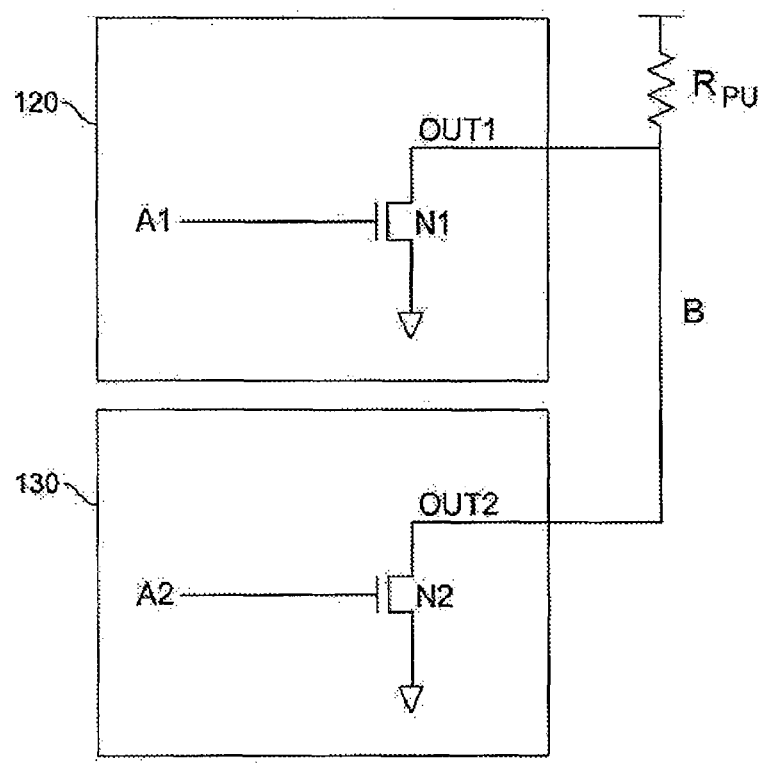
Fig. 1B *(Prior Art)*
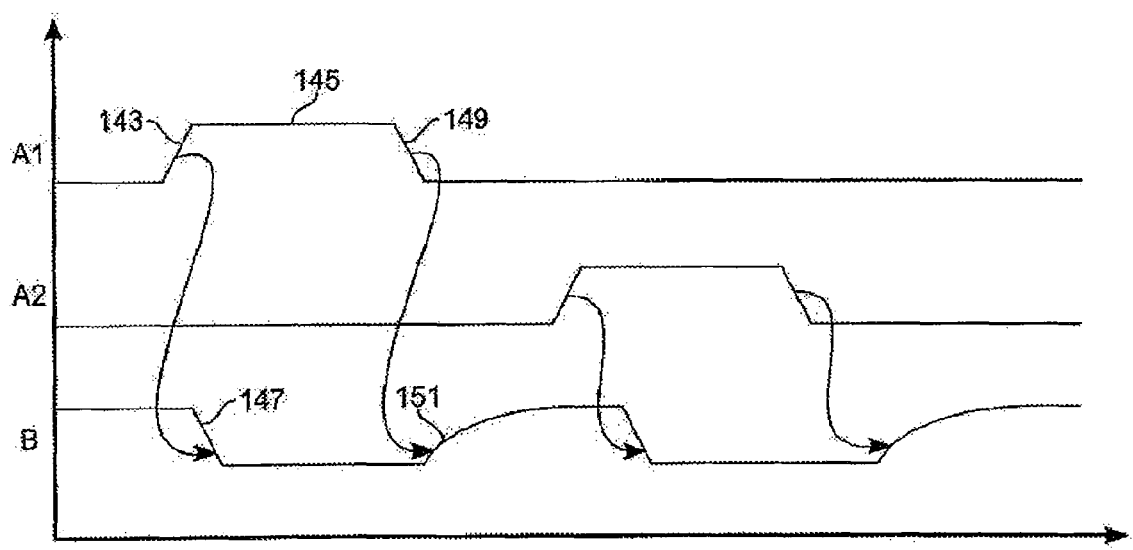
Fig. 1C *(Prior Art)*

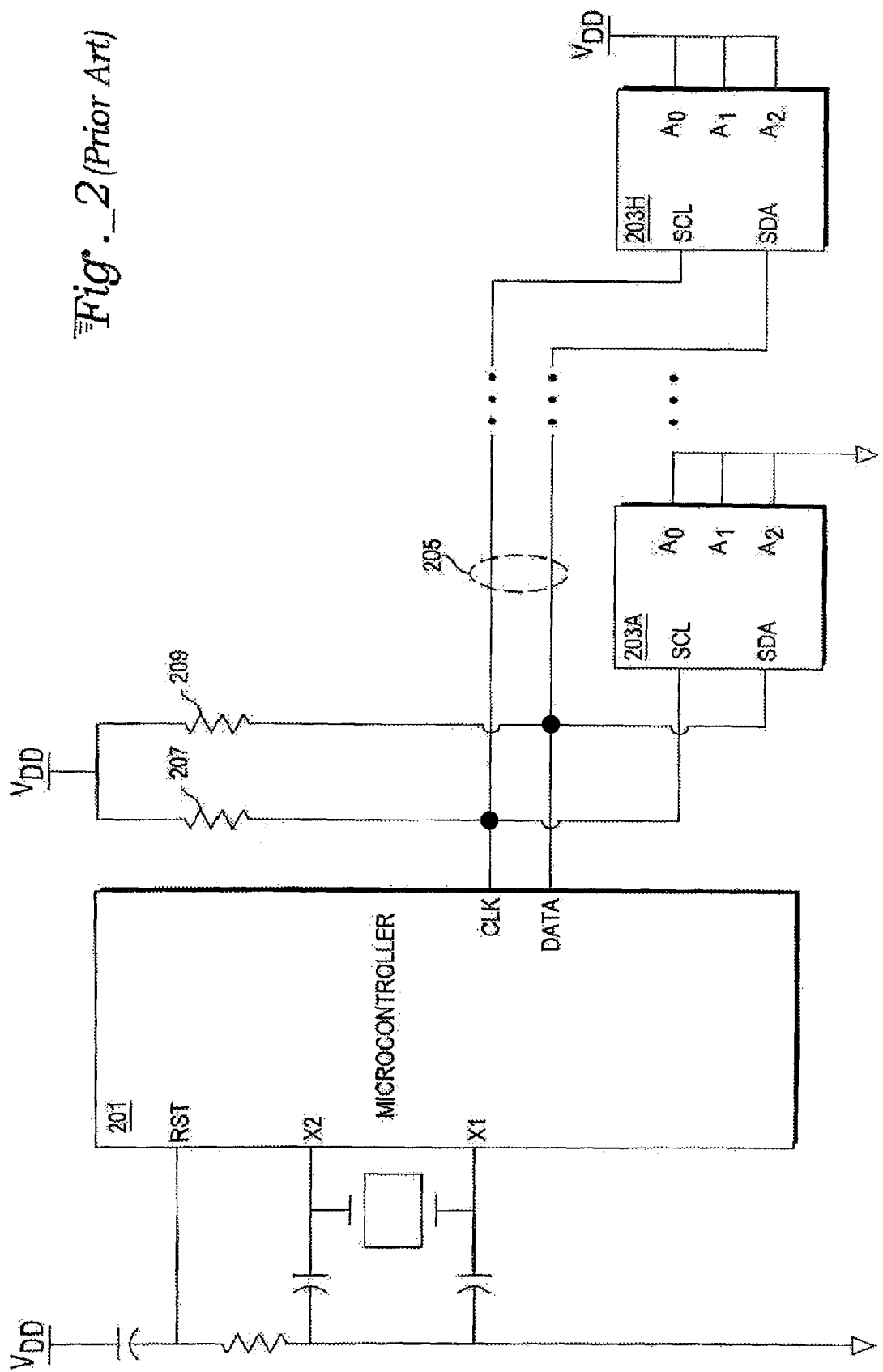
Fig. _2 (Prior Art)

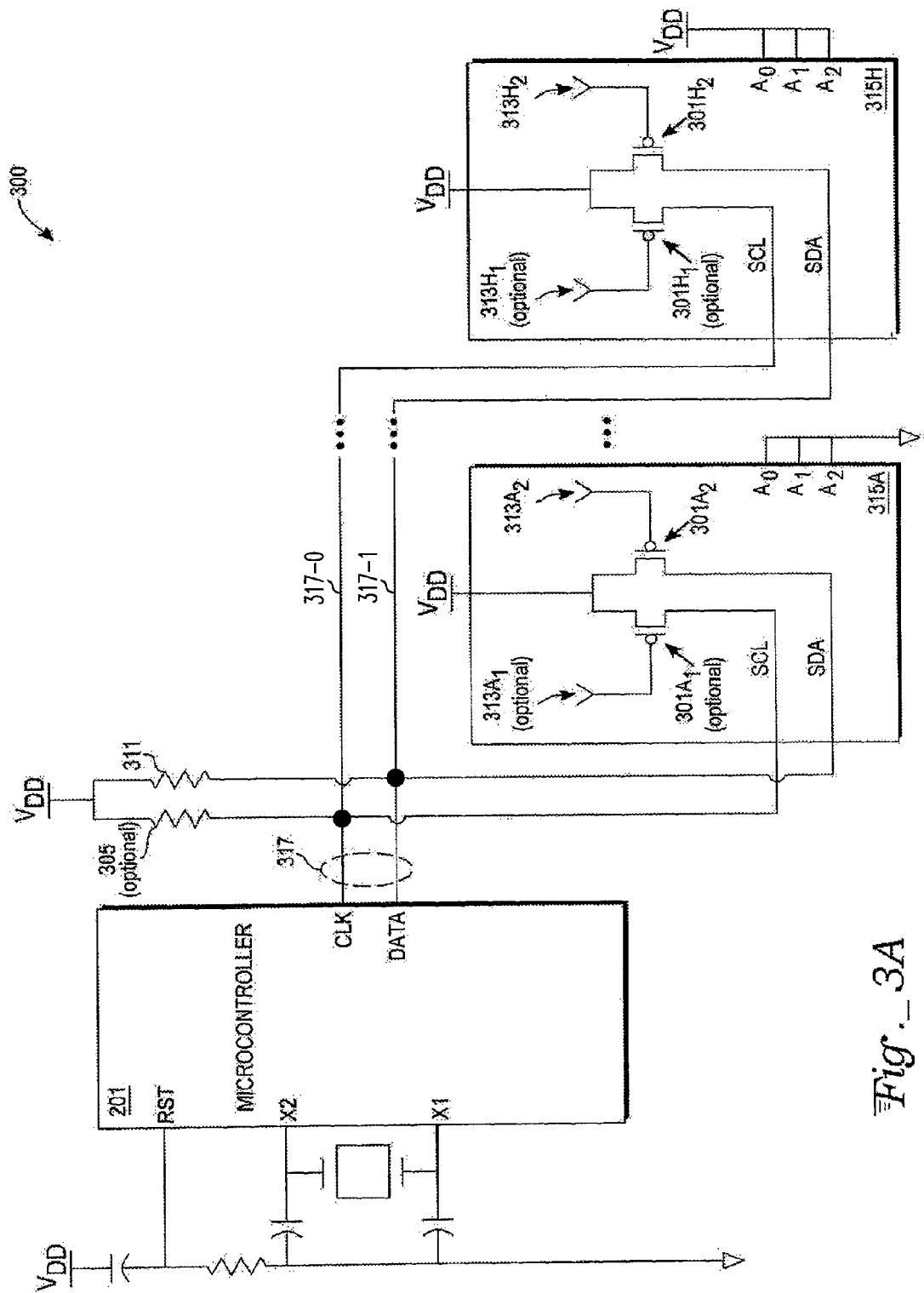
Fig._3A

SERIAL COMMUNICATIONS BUS WITH ACTIVE PULLUP

TECHNICAL FIELD

The invention to a bus architecture for transferring information between electronic devices. More specifically, the present invention relates to a dual-wire bus architecture with active pullup devices.

BACKGROUND ART

Many similarities exist between seemingly unrelated designs in consumer, industrial, and telecommunication electronics. Examples of similarities include intelligent control, general-purpose circuits (e.g., LCD drivers and I/O ports) and application-oriented circuits. One prior art two-wire bus is a bi-directional two-wire, low to medium speed, serial communication bus designed to exploit such similarities in electrical circuits. The two-wire bus was developed in the early 1980s and was created to reduce manufacturing costs of electronic products.

Prior to the two-wire bus, chip-to-chip communications used a large plurality of pins in a parallel interface. Many of these pins were used for chip-to-chip addressing, selection, control, and data transfers. For example, in a parallel interface, eight data bits are typically transferred from a sender integrated circuit (IC) to a receiver IC in a single operation. The two-wire buts performs chip-to-chip communications using two wires in a serial interface, allowing ICs to communicate with fewer pins. The two wires in the bus carry addressing, selection, control, and data, serially, one bit at a time. A data (SDA) wire carries the data, while a clock (SCL) wire synchronizes the sender and receiver during the transfer. ICs utilizing the two-wire bus can perform similar functions to their larger parallel interface counterparts, but with far fewer pins.

Two-wire bus devices are classified as master or slave. A device that initiates a message is called a master (multiple masters are possible), while a device that responds to a message is called a slave (multiple slaves are also possible). A device can potentially be master, slave, or switch between master and slave, depending on a particular device and application. Hence, the device may at one point in time be a master while the device later takes on a role as slave. The two-wire bus can connect a plurality of ICs using two-wires (SDA and SCL, described supra).

Contemporary two-wire slave devices maintain a unique address. Therefore, part of a two-wire protocol requires a slave address at the beginning of a message. (Two-wire protocol specifications are well known. See, for example, U.S. Published Patent Application 2002/0176009 to Johnson et al. entitled "Image Processor Circuits, systems, and Methods.") Consequently, all devices on the two-wire bus hear the message, but only the slave that recognizes its own address communicates with the master. Devices on the two-wire bus are typically accessed by individual addresses, for example, 00-FF where even addresses are used for writes and odd addresses are used for reads.

Since two-wire buses can connect a number of devices simultaneously to the same pair of bus wires, a problem results when one of the devices malfunctions and pulls a bus signal (clock or data) low; the bus becomes inoperative and a determination of which of the numerous devices connected to the two-wire bus is responsible becomes difficult. A similar problem occurs when one of the bus conductors becomes shorted to a low impedance source, such as, for example, a ground potential.

FIG. 1 is a prior art example of a practical application of a two-wire bus. FIG. 1 includes a digital signal processor (DSP) 115 (here, the DSP 115 functions as a master device). External pins of the DSP 115 are a bidirectional data pin (SDA) and a serial clock (SCL) pin, both of which are coupled to various slave devices 107, 109 on the two-wire bus via a serial data line 103 and a serial clock line 105. Both the serial data line 103 and the serial clock line 105 are connected respectively via a first 111 and second 113 external pullup resistor to a positive supply voltage $V_{DD}$ on a power supply line 101. When the two-wire bus is free, the serial data line 103 is at logic HIGH. Output stages of the slave devices 107, 109 connected to the two-wire bus typically have an open-drain or open-collector in order to perform a wired-OR function. Data on the contemporary prior art two-wire bus is transferred at a rate of up to 400 kbits/sec in fast mode. According to the two-wire specification, the number of interfaces to the bus is dependent, in part, to limiting bus capacitance to 400 picofarads.

In another practical example of an application of a two-wire bus, FIG. 1B, a data portion of a first 120 and a second 130 integrated circuit each connect to a data bus B. In the first integrated circuit 120 a data input A1 connects to the gate input of an KNOS transistor N1. A source node of the NMOS transistor N1 connects to GND. The NMOS transistor N1 has its drain configured as an output OUT1 of the first integrated circuit 120 which connects to the data bus B.

The second integrated circuit 130 is configured identically to the first integrated circuit 120. For instance, a data input A2, an NMOS transistor N2, and an output OUT2 are all arranged and connected as their counterparts are in the first integrated circuit 120. The second integrated circuit 120 is connected to the data bus B at the output OUT2 in a wired-OR configuration. The voltage potential of the data bus B is pulled up to $V_{DD}$ by a pullup resistor $R_{PU}$ when not pulled-down by either of the NMOS transistors N1, N2.

With Reference to FIG. 1C, a rising edge 143 of a positive data pulse 145, applied at the data input A1 of the first integrated circuit 120 (FIG. 1B), triggers the NMOS transistor N1 to conduct and cause a falling edge 147 as the data bus B is pulled to a low logic level. A falling edge 149 of the positive data pulse 145 deactivates the NMOS transistor N1, allowing the pullup resistor $R_{PU}$ to begin a rising ramp 151 of the potential of the data bus B. The rising ramp 151 of the potential of the data bus B progresses at a rate equal to an RC time constant of the network. The data input A2 and the output OUT2 of the second integrated circuit 130 operate on the data bus B analogously to the first integrated circuit 120. In this way a wired-OR type of driver connection between multiple integrated circuits 120, 130 is accomplished.

With reference to FIG. 2, another prior art application of a two-wire bus includes a microcontroller 201 with two of the I/O pins used for clock ("CLK") and data ("DATA") signals coupled to a first serial EEPROM memory device 203A and an eighth serial EEPROM memory device 203H. Up to eight serial EEPROM devices may share a two-wire bus 209 under the two-wire protocol (partially described herein), utilizing the same two microcontroller CLK and DATA I/O pins. Each serial EEPROM device must have its own address inputs ($A_0$, $A_1$, and $A_2$) hard-wired to a unique address to be accessible. With continued reference to FIG. 2, the first serial EEPROM device 203A recognizes address zero ("0") ($A_0$, $A_1$, and $A_2$ are all tied LOW) while the eighth serial EEPROM device 203H recognizes address seven ("7") ($A_0$, $A_1$, and $A_2$ are all tied HIGH) The serial EEPROM devices 203A . . . 203H are slave devices, receiving or transmitting data received on the two-wire bus 205 in response to orders from a master device; here, the microcontroller 201 is the master device.

The microcontroller 201 initiates a data transfer by generating a start condition on the two-wire bus 205. This start condition is followed by a byte containing the device address of the intended EEPROM device 203A . . . 203H. The device address consists of a four-bit fixed portion and a three-bit programmable portion. The fixed portion must match a value hard-wired into the slave, while the programmable portion allows the microcontroller 201, acting as master, to select between a maximum of eight slaves on the two-wire bus 205. An eighth bit specifies whether a read or write operation will occur.

The two-wire bus 205 is tied to $V_{DD}$ through a clock line weak resistor 207 and a data line weak resistor 209. If no device is pulling the two-wire bus 205 to ground, the bus 205 will be pulled up by the weak resistors 207, 209 indicating a logic "1" (HIGH). If the microcontroller 201 or one of the EEPROM memory device 203A . . . 203H slaves pulls the bus 205 to ground, the bus will indicate a logic "0" (LOW).

However, despite a widespread use of the two-wire bus, the bus suffers from numerous drawbacks. For example, the two-wire bus is noisy, requiring a noise suppression circuit to filter noise when data are present on the bus. The noise suppression circuit reduces EEPROM device I/O speed. Further, when an EEPROM device outputs a logic "1" onto the two-wire bus, the device relies on the weak resistor to pullup the bus. Therefore, a data transfer rate is limited by the strength of the weak resistor 209 due to an increased RC time constant. It a stronger resistor is employed, a stronger pulldown device is required thus consuming more current to output a logic "0" onto the bus.

Therefore, what is needed is a dual-wire bus that is usable with contemporary communication specifications and protocols that produces less noise and is capable of higher data transfer rates.

SUMMARY

The present invention achieves a high speed data transfer rate through, inter alia, a use of active pullup devices operating in conjunction with pullup resistors. The active pullup devices serve to reduce a time required due to the RC time constant and minimize noise, both due primarily to the pullup resistor operating independently in the prior art. However, system designers using the present invention may still utilize existing two-wire protocols and specifications, existing software, and existing cascading configurations (i.e., multiple slave devices on the dual-wire bus). Existing serial EEPROM devices may continue to be utilized as no additional pins are required for implementation of the invention.

In one exemplary embodiment, the present invention is a dual-wire communications bus circuit, compatible with existing two-wire network specifications and protocols that include a first part of the communications bus circuit coupled to a first line of a communications bus, where the first line carries data signals from a master device to one or more slave devices, and a second part of the communications bus circuit coupled to a second line of the communications bus, where the second line carries clock signals from the master device to the one or more slave devices. A pullup resistor is located in each part of the communications bus circuit; the pullup resistor in the first part is coupled to the first line of the communications bus and the pullup resistor in the second part is coupled to the second line of the communications bus. To improve data throughput and reduce noise, an active pullup device is located in each part of the communications bus circuit; the active pullup device may produce a high logic level on one of the communications bus lines.

In another embodiment, the present invention is a memory device incorporating a dual-wire communications bus circuit; the memory device includes a first part of the communications bus circuit coupled to a first line of a communications bus, where the first line carries data signals from a master device to one or more slave devices, and a second part of the communications bus circuit coupled to a second line of the communications bus, where the second line carries clock signals from the master device to the one or more slave devices. The memory device further includes a memory circuit to store data bits and incorporates both the first and second parts of the communication bus circuit. A pullup resistor located in each part of the communications bus circuit is coupled to the first line of the communications bus and the pullup resistor in the second part is coupled to the second line of the communications bus. Additionally, an active pullup device is coupled to at least one of the pullup resistors thus forming an active pullup pair; the active pullup pair may produce a high logic level on one of the communications bus lines. Optionally, an active pulldown device may also be located in at least one part of the communications bus circuit whereby the active pulldown device may provide for a low logic level on one of the communications bus lines.

BRIEF DESCRIPTION OF THE DRAWINGS

FIG. 1A is a two-wire bus of the prior art used in a digital signal processing application.

FIG. 1B is a data bus portion of a prior art digital signal processing application.

FIG. 1C is a waveform diagram corresponding to the data bus of FIG. 1B.

FIG. 2 is a two-wire bus of the prior art used in an application where a microcontroller accesses a plurality of memory devices.

FIG. 3A is an application of a microcontroller accessing one or more serial EEPROM memory devices over all dual-wire communications bus coupled to an exemplary pullup circuit.

DETAILED DESCRIPTION

Figure 3B:
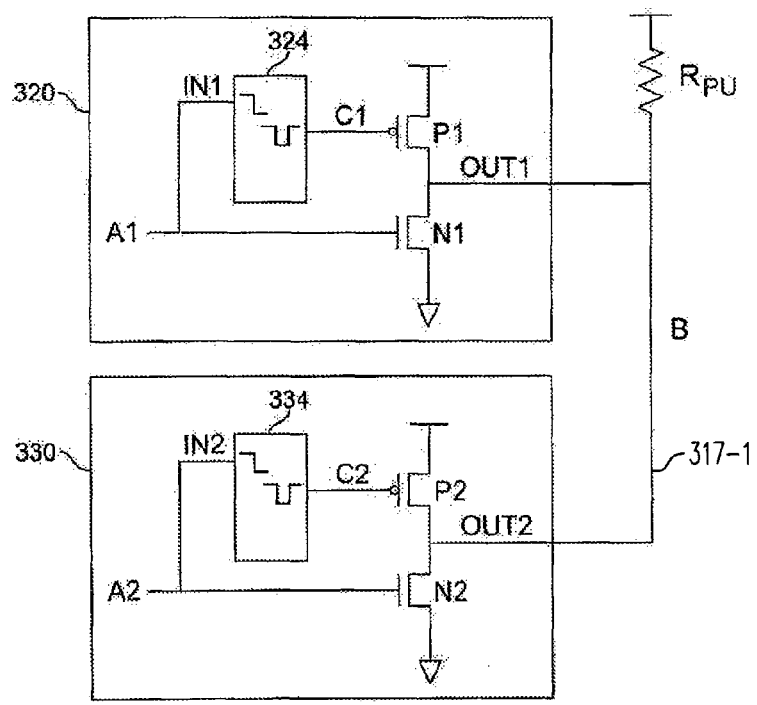
FIG. 3B is a logic block diagram of an application of the exemplary pullup circuit coupled to a data bus portion of the dual-wire communications bus.

With reference to FIG. 3A, a microcontroller-memory circuit 300 includes a microcontroller 201, one or more EEPROM memory devices 315A . . . 315H and a dual-wire communications bus 317. The dual-wire bus 317 contains a clock-line (CLK) and a data-line (DATA). Pullup of the dual-wire bus is controlled by one or more exemplary active pullup circuits of the present invention. The exemplary pullup circuit includes a weak CLK pullup resistor 305 (the CLK pullup resistor 305 is optional) a weak DATA pullup resistor 311, and one or more active pullup devices described infra. Some or all of components of the exemplary pullup circuit may be built-in to the one or more FEPROM memory devices 315A . . . 315H. Alternatively, other types of memory circuit or slave devices may be used, or the pullup circuit may optionally be a standalone circuit or IC, or may be part of another IC device. Each of the EEPROM memory devices 315A . . . 315H may contain an active data pullup device $301A_2 \ldots 301H_2$ (shown as PMOS devices in this exemplary embodiment) connected to the DATA line through an SDA pin, and an optional active clock pullup device $301A_1 \ldots 301H_1$ connected to the CLK line through an SCL pin. Optional pulldown devices (not shown) may be added directly to the CLK and DATA lines of the dual-wire bus 317. Such a pulldown arrangement is described in more detail with respect to FIG. 3B, infra.

When, for example, the EEPROM memory device 315A drives a logic "1" onto the DATA line of the dual-wire bus 317, the memory device 315A need not rely on only the weak data pullup resistor 311. Instead, the memory device 315A initially relies on a brief activation of the active data pullup device $301A_2$. Consequently, transient noise is minimized in the microcontroller-memory circuit 300 and data transfer rates to and from the microcontroller 201 and the EEPROM memory device 315A are greatly increased (discussed in more detail with reference to FIG. 4, infra).

Note that each active pullup device $301A_1 \ldots 301H_1$; $301A_2 \ldots 301H_2$ is initially activated by a program pulse being coupled to gates of the active pullup devices $301A_1 \ldots 301H_1$; $301A_2 \ldots 301H_2$ through a plurality of gate-terminals $313A_1 \ldots 313H_1$; $313A_2 \ldots 313H_2$. The active pullup devices $301A_1 \ldots 301H_1$; $301A_2 \ldots 301H_2$ only need to be turned on for a short period of time (e.g., a few milliseconds); the pullup resistors 305, 311 will continue the pullup to $V_{DD}$ and hold the DATA and/or CLK lines of the dual-wire bus 317 as long as required. After the dual-wire bus starts to be driven HIGH (i.e., to a state of logic "1"), the program pulse applied to one or more of the gate-terminals $313A_1 \ldots 313H_1$; $313A_2 \ldots 313H_2$ goes HIGH, thus shutting off the appropriate pullup device $301A_1 \ldots 301H_1$; $301A_2 \ldots 301H_2$. The logic "1" will be maintained thereafter by one or both of the pullup resistors 305, 311. Alternatively, the microcontroller 201 may separately drive a logic "1" onto one or both wires of the dual-wire bus 305 without relying on either of the pullup resistors 305, 311. Further, pulldown devices (not shown) similar in function to the pullup devices described supra may be incorporated either internally or externally to the one or more EEPROM memory devices 315A . . . 315H. One possible configuration of a pulldown device is described with reference to FIG. 3B, infra.

Pulse generation and pulse width, as applied to the gate-terminals $313A_1 \ldots 313H_1$; $313A_2 \ldots 313H_2$ may be controlled by existing protocols. The microcontroller 201 as master, may initiate the protocol and communication process. In an alternative embodiment, the one or more EEPROM memory devices 315A . . . 315H may be comprised of one or more microcontrollers (not shown) with the protocol defining a process to establish a master-slave relationship. An exemplary protocol that may be used is the Atmel Corporation 2-wire serial EEPROM protocol for an AT24C128 or an AT24C256 device.

With reference to FIG. 3B, a first 320 and a second 320 exemplary integrated circuit each form a connection to a data bus B (317-1). Connections between the first 320 and the second 330 integrated circuit represent a DATA line portion of the dual-wire bus 317 (FIG. 3A) described supra. In the first integrated circuit 320, a data input terminal A1 connects to the gate input of an NMOS transistor N1 and an input IN1 of a negative one-shot logic gate 324. The negative one-shot logic gate 324 is triggered by a negative edge of a signal at the input IN1. An output C1 of the negative one-shot logic gate 324 connects to the gate input of a PMOS transistor P1. A source node of the PMOS transistor P1 connects to VDD and a source node of the NMOS transistor N1 connects to GND. The NMOS transistor N1 and the PMOS transistor P1 have their respective drains connected in common as an output OUT1 of the first integrated circuit 320. The output OUT1 connects to the data bus B.

The second integrated circuit 330 is configured similarly to the first integrated circuit 320. A data input terminal A2, a negative one-shot logic gate 334 with an output C2, and an NMOS transistor N2 and a PMOS transistor P2 with common output OUT2, are all arranged and connected as similar components are in the first integrated circuit 320. The voltage potential of the data bus B is pulled up to $V_{DD}$ by a pullup resistor $R_{PU}$ when neither of the NMOS transistors N1, N2 is conducting.

Figure 3C:
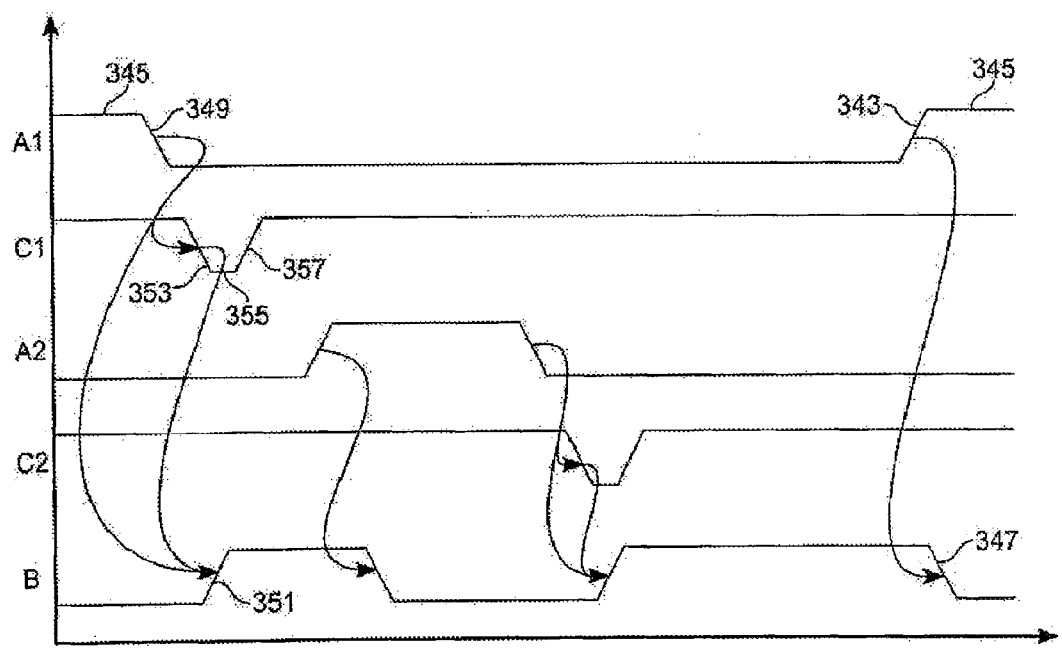
FIG. 3C is a waveform diagram corresponding to the dual-wire communications bus of FIG. 3B.

With reference to FIG. 3C, a falling edge 349 of a positive data pulse 345 applied at the data input terminal A1 of the first integrated circuit 320 (FIG. 3B), deactivates the NNOS transistor N1 allowing the pullup resistor $R_{PU}$ to begin a rising edge 351 in the potential of the data bus B. The falling edge 349 of the positive data pulse 345 also triggers the negative one-shot logic gate 324. On triggering, a falling edge 353 of a negative pulse 353 is produced at the output C1 of the negative one-shot logic gate 324. The negative pulse 355 at the output C1 causes the PMOS transistor P1 to temporarily conduct and contribute in parallel with the drive of the pullup resistor $R_{PU}$ to the rising edge 351 in the potential of the data bus B. For the duration of the negative pulse 355 from the negative one-shot logic gate 324 the potential of the data bus B at the rising edge 351 increases rapidly due to the pullup resistor $R_{PU}$ and the PMOS transistor P1 operating in parallel.

After the negative pulse 355 from the negative one-shot logic gate 324 ends, a rising edge 357 of the negative pulse 355 deactivates the PMOS transistor P1 and a rate at which the potential of the data bus B rises is determined by the pullup resistor $R_{PU}$ and the capacitance of the data bus B as discussed infra. A rising edge 343 of the positive data pulse 345, applied at the data input A1 of the first integrated circuit 320 (FIG. 3B), triggers the NMOS transistor N1 to conduct and cause a falling edge 347 as the data bus B is pulled to a low logic level. The data input terminal A2 and the output C2 of the negative one-shot logic gate 334 of the second integrated circuit 330 operate on the data bus B analogously to the first integrated circuit 320. In this way, a wired-OR type of driver connection with enhanced speed characteristics between the first 320 and second 330 integrated circuits is exemplified.

Figure 4:
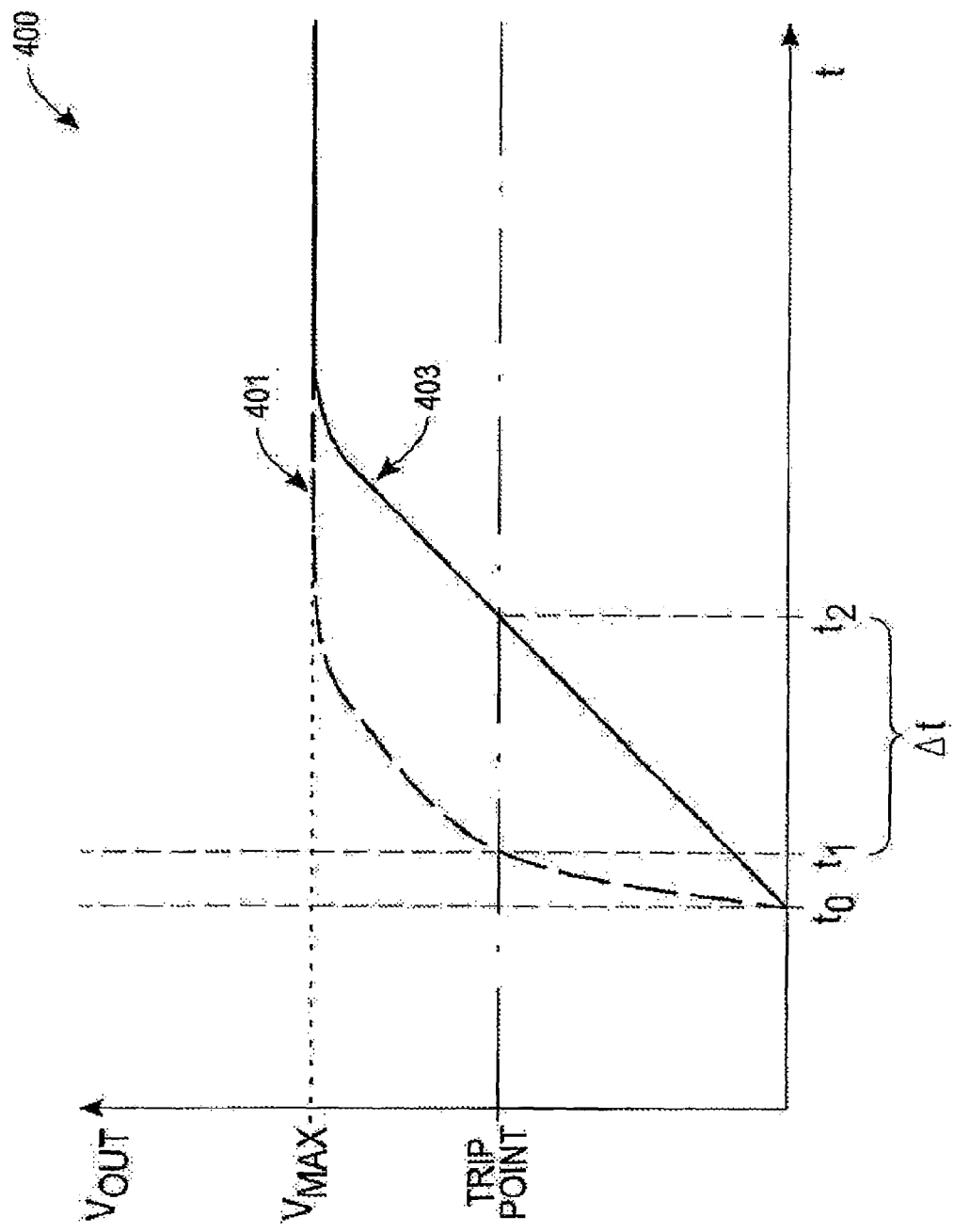
FIG. 4 is a timing diagram comparing relative speeds of the dual-wire communications bus incorporating the present invention to the prior art two-wire bus.

With reference to FIG. 4, a timing diagram 400 compares relative time constants of a two-wire bus of the prior art with the present invention. A first curve 401 represents relative timing for a dual-wire bus of the present invention while a second curve 403 represents relative timing for the prior art two-wire bus. From time $t_0$ to time $t_1$, the first curve 401 increases in voltage quickly due to an active pullup device (for example, the active pullup device $301A_2$, FIG. 3A) being turned on. At time $t_1$, the active pullup device $301A_2$ turns off and the voltage on the DATA line of the dual-wire bus 317 continues to increase to $V_{MAX}$ and is maintained due to the pullup resistor 311. However, the voltage-to-time slope of the first curve 401 has decreased past $t_1$ to a point where the slope matches that of the second curve 403 of the prior art. The slope past point $t_1$ on the first curve 401, and the slope of the entirety of the second curve 403, is due to the RC time constant of each circuit when a pullup resistor is employed. Therefore, an overall time required to drive a line to logic "1" has been reduced significantly, by a time $\Delta t$, as a result of the active pullup circuit of the present invention.

A skilled artisan will recognize that equivalent functioning circuits exist that differ from the first 320 or second 330 integrated circuit (FIG. 3B) in arrangement and composition. For instance, a negative pulse may be generated from a cross coupling of NAND or NOR logic gates and another exemplary pulldown device may be fabricated from a junction field effect transistor.

In the foregoing specification, the present invention has been described with reference to specific embodiments thereof. For example, although active pullup devices described herein are defined in terms of PMOS transistors, a skilled artisan will realize that other active devices, such as a bipolar device or tristate buffer may be readily implemented as well. It will, therefore, be evident that various modifications and changes can be made thereto without departing from the broader spirit and scope of the present invention as set forth in the appended claims. The specification and drawings are, accordingly, to be regarded in an illustrative rather than a restrictive sense.

What is claimed is:

1. A circuit, comprising:
   a plurality of memory devices, each memory device including a first part and a second part, the first part including a one-shot device coupled to a first active pullup device, the first active pullup device coupled to a first line of a communications bus and to a first pullup resistor, the first line being capable of carrying data signals from a microcontroller to one or more of the plurality of memory devices, the second part coupled to a second line of the communications bus, the second line being capable of carrying clock signals from the microcontroller to the one or more memory devices; and
   wherein the one-shot device is configured to receive the data signals from the microcontroller, to detect a rising edge of the data signals and to produce a program pulse at a gate of the first active pullup device in response to the rising edge, the first active pullup device capable of being operatively coupled to the first pullup resistor thereby forming a first active pullup pair, the first active pullup device configured to produce a high logic level on the first line of the communications bus without relying on the first pullup resistor.

2. The circuit of claim 1, further comprising:
   a second active pullup device located in at least one of the memory devices the second active pullup device capable of being operatively coupled to a second pullup resistor thereby forming a second active pullup pair, the second active pullup pair being configured to produce a high logic level on the second line of the communications bus.

3. The circuit of claim 2 further comprising an input terminal configured to accept an activation signal, the input terminal being coupled to the first active pullup device through the one-shot device.

4. The circuit of claim 1 further comprising an active pulldown device coupled to at least one line of the communications bus, the active pulldown device being configured to produce a low logic level on the at least one line of the communications bus.

5. The circuit of claim 4 wherein the active pulldown device includes an NMOS transistor.

6. The circuit of claim 1 wherein the first active pullup device includes a PMOS transistor.

7. The circuit of claim 1 wherein the first active pullup device includes a PNP transistor.

8. The circuit of claim 1 wherein each part of each memory device includes a part of an EEPROM memory device.

9. A circuit, comprising:
   a plurality of memory devices, the plurality of memory devices including a first part and a second part, the first part including a first active pullup device coupled to a first line of a communications bus and to a first pullup resistor, the first line being capable of carrying data signals from a microcontroller to one or more of the plurality of memory devices, the second part coupled to a second line of the communications bus, the second line being capable of carrying clock signals from the microcontroller to the one or more memory devices;
   a first active pullup device located in the first part of one or more memory devices, wherein the first active pullup device is activated by a program pulse coupled to a gate of the first active pullup device that is configured to provide a high logic level on the first line of the communications bus without relying on the first pullup resistor; and
   a one-shot device located in the first part of the one or more memory devices, the one-shot device configured to receive the data signals from the microcontroller, to detect a rising edge of the data signals and to produce the program pulse in response to the detected rising edge.

10. The circuit of claim 9, further comprising:
    a second active pullup device located in the second part of the circuit, the second active pullup device for operatively acting with a second pullup resistor and producing a high logic level on the second line of the communications bus.

11. The circuit of claim 10 further comprising an input terminal configured to accept an activation signal, the input terminal being coupled to the one-shot device.

12. The circuit of claim 9 wherein the first active pullup device includes a PMOS transistor.

13. The circuit of claim 9 wherein the first active pullup device includes a PNP transistor.

14. The circuit of claim 9 wherein each part of the circuit includes a part of an EEPROM memory device.

15. A memory device incorporating a dual-wire communications bus circuit, the memory device comprising:
    a first part of the communications bus circuit configured to couple to a first line of a communications bus and to a first pullup resistor, the first line being capable of carrying data signals from a master device to one or more slave devices;
    a second part of the communications bus circuit configured to couple to a second line of the communications bus, the second line being capable of carrying clock signals from the master device to the one or more slave devices;
    a memory circuit configured to store data bits, the memory circuit including the first and second parts of the communications bus circuit; and
    a first active pullup device located in the first part of the communications bus circuit, the first active pullup device including a one-shot device, the one shot device configured to receive the data signals from the master device, to detect a rising edge of the data signals and to generate a program pulse to activate the first active pullup device in response to the detected rising edge, the first active pullup device operatively coupled to the first pullup resistor thereby forming a first active pullup pair, the first active pullup pair being configured to initiate a high logic level on the first line of the communications bus without relying on the first pullup resistor.

16. The memory device of claim 15 further comprising:
    a second active pullup device located in the second part of the communications bus circuit, the second active pullup device capable of being operatively coupled to a second pullup resistor thereby forming a second active pullup pair, the second active pullup pair being configured to produce a high logic level on the second line of the communications bus.

17. The memory device of claim 15 further comprising an input terminal configured to accept an activation signal, the input terminal being coupled to the first active pullup device through the one-shot device.

18. The memory device of claim 15 wherein the memory includes an EEPROM-type memory device.

19. The memory device of claim 15 further comprising an active pulldown device coupled to at least one line of the communications bus, the active pulldown device being configured to produce a low logic level on the at least one line of the communications bus.

20. A memory device incorporating a dual-wire communications bus circuit, the device comprising:
a first part of the communications bus circuit configured to couple to a first line of a communications bus, the first line configured to carry data signals from a master device to one or more slave devices;
a second part of the communications bus circuit configured to couple to a second line of the communications bus, the second line being configured to carry clock signals from the master device to the one or more slave devices;
a memory circuit configured to store data bits, the memory circuit including the first and second parts of the communications bus circuit;
a first and a second pullup resistor each coupled to the first and second parts of the communications bus circuit respectively, the first pullup resistor coupled to the first line of the communications bus and the second pullup resistor coupled to the second line of the communications bus;
a first and a second active pullup device located in the first and the second parts of the communications bus circuit respectively, the first and second active pullup devices activated by program pulses coupled to gates of the first and second active pullup devices that are each separately coupled to the first and second pullup resistors respectively thereby forming a first and second active pullup pair, each active pullup pair configured to produce a high logic level on the first and second lines of the communications bus without relying on the first and second pullup resistors respectively; and
a first and second one-shot device configured to detect a rising edge of the data signals and the clock signals, respectively, and to generate the program pulses in response to the detected rising edges, the first one-shot device coupled to the gate of the first active pullup device, and the second one-shot device coupled to the gate of the second active pullup device.

21. The memory device of claim 20 wherein the memory circuit includes an EEPROM-type memory device.

22. The memory device of claim 20 further comprising an input terminal configured to accept an activation signal, the input terminal being coupled to each of the one-shot devices.

23. The memory device of claim 20 further comprising an active pulldown device coupled to at least one line of the communications bus, the active pulldown device being configured to produce a low logic level on the at least one line of the communications bus.

24. A method of transmitting signals over a serial communications bus, the method comprising:
communicating data, using a first wire of the serial communications bus connecting a microcontroller and a plurality of memory devices;
transmitting either a high speed clock signal or a low speed clock signal between the microcontroller and the memory devices using a second wire of the serial communications bus;
asserting an activation signal through a one-shot gate to at least one of a plurality of active pullup devices disposed in the plurality of memory devices, the plurality of active pullup devices including a first active pullup device coupled between the first wire and a voltage source, and a second active pullup device coupled between the second wire and the voltage source, and wherein the asserting the activation signal includes receiving the activation signal at an input of the one-shot gate; and
generating a high logic level on the first and second wires of the serial communications bus without relying on pullup resistors.

25. The method of claim 24 wherein the first active pullup device and the second active pullup device are each selected to be a PMOS transistor.

26. The method of claim 25 further comprising coupling a first weak pullup resistor in parallel with the first pullup device.

27. The method of claim 25 further comprising coupling a second weak pullup resistor in parallel with the second pullup device.

28. The method of claim 24 wherein asserting the activation signal on the first active pullup device results in pulling a data signal to a logical "1."

29. The method of claim 24 wherein asserting the activation signal on the second active pullup device results in pulling the clock signal to a logical "1."

30. The method of claim 24 wherein the activation signal is selected to provide a brief pullup signal.

31. The method of claim 24 wherein the first active pullup device and the second active pullup device are selected to be located in each of the plurality of memory devices.

32. The method of claim 24 further comprising a first active pulldown device and a second active pulldown device, each of the active pulldown devices respectively selected to be coupled between the first wire and a ground potential and the second wire and the ground potential.

33. The method of claim 32 wherein the first active pulldown device and the second active pulldown device are selected to be located in each of the plurality of memory devices.

34. The method of claim 32 further comprising briefly asserting a pulldown signal on the first active pulldown device, thereby pulling the data signal to a logical "0".

35. The method of claim 32 further comprising briefly asserting a pulldown signal on the second active pulldown device, thereby pulling the clock signal to a logical "0."

36. The method of claim 32 wherein the first active pulldown device and the second active pulldown device are each selected to be an NMOS transistor.

* * * * *

UNITED STATES PATENT AND TRADEMARK OFFICE
CERTIFICATE OF CORRECTION

| | |
|---|---|
| PATENT NO. | : 7,868,660 B2 |
| APPLICATION NO. | : 11/379473 |
| DATED | : January 11, 2011 |
| INVENTOR(S) | : Philip S. Ng et al. |

It is certified that error appears in the above-identified patent and that said Letters Patent is hereby corrected as shown below:

On the face page, in field (56), under "Other Publications", in column 2, line 1, delete "The-I2C" and insert -- The I2C --, therefor.

On page 2, under "Other Publications", in column 1, line 1, delete "I2C" and insert -- I2C --, therefor.

On page 2, under "Other Publications", in column 1, line 3, delete "I2C" and insert -- I2C --, therefor.

On page 3, under "Other Publications", in column 2, line 1, delete "I2C" and insert -- I2C --, therefor.

In column 1, line 30, delete "buts" and insert -- bus --, therefor.

In column 2, line 27, delete "KNOS" and insert -- NMOS --, therefor.

In column 2, line 59, delete "209" and insert -- 205 --, therefor.

In column 3, line 1, delete "HIGH)" and insert -- HIGH). --, therefor.

In column 3, line 31, delete "It" and insert -- If --, therefor.

In column 4, line 41, delete "all" and insert -- an --, therefor.

In column 4, line 57, delete "315H" and insert -- 315H, --, therefor.

In column 4, line 63, delete "optional)" and insert -- optional), --, therefor.

In column 4, line 66, delete "FEPROM" and insert -- EEPROM --, therefor.

Signed and Sealed this
Twenty-ninth Day of March, 2011

David J. Kappos
*Director of the United States Patent and Trademark Office*

CERTIFICATE OF CORRECTION (continued)
U.S. Pat. No. 7,868,660 B2

In column 5, line 57, delete "320" and insert -- 330 --, therefor.

In column 6, line 19, delete "NNOS" and insert -- NMOS --, therefor.

In column 6, line 24, delete "353" and insert -- 355 --, therefor.